US011380618B2

(12) United States Patent
Frederick, Jr. et al.

(10) Patent No.: US 11,380,618 B2
(45) Date of Patent: Jul. 5, 2022

(54) POWER DISTRIBUTION CIRCUITRY

(71) Applicant: Arm Limited, Cambridge (GB)

(72) Inventors: Marlin Wayne Frederick, Jr., Austin, TX (US); Karen Lee Delk, Austin, TX (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 15/887,972

(22) Filed: Feb. 2, 2018

(65) Prior Publication Data

US 2019/0244900 A1    Aug. 8, 2019

(51) Int. Cl.
*H01L 23/528* (2006.01)
*H02J 1/08* (2006.01)
*H01L 23/522* (2006.01)
*H01L 23/535* (2006.01)
*H01L 23/538* (2006.01)
*H01L 23/64* (2006.01)
*H01L 27/02* (2006.01)

(52) U.S. Cl.
CPC ...... *H01L 23/5286* (2013.01); *H01L 23/5221* (2013.01); *H01L 23/5226* (2013.01); *H01L 23/5283* (2013.01); *H01L 23/535* (2013.01); *H01L 23/5381* (2013.01); *H01L 23/5386* (2013.01); *H01L 23/647* (2013.01); *H01L 27/0207* (2013.01); *H02J 1/08* (2013.01)

(58) Field of Classification Search
CPC ............... H01L 23/5286; H01L 23/647; H01L 23/5283; H01L 23/5226; H01L 23/5221; H01L 23/528; H01L 23/5381; H01L 23/5386; H01L 23/535
See application file for complete search history.

(56) References Cited

U.S. PATENT DOCUMENTS

2011/0304052 A1* 12/2011 Turner ............... H01L 23/5286
  257/773
2015/0348962 A1* 12/2015 Chao .................. H01L 23/5283
  257/207

OTHER PUBLICATIONS

Todri, Alda; "On-chip Power Distribution in Deep Submicron Technologies"; Published online before Oct. 15, 2016; Electrical and COmputer Engineering Department at University of Californica Santa Barbara.*
Zhao, Larry; "All About Interconnects"; Dec. 18, 2017; Semiconductor Engineering—Manufacturing & Process Technology Opinion Section.*
Havemann et al. "High-Performance Interconnects: An Integration Overview", Proceedings of the IEEE, vol. 89, No. 5, May 2001, pp. 586-601 (Year: 2001).*
Multiple Patterning; Wikipedia; Jan. 27, 2018. https://en.wikipedia.org/wiki/Multiple_patterning.
PCT International Search Report and Written Opinion; PCT/GB2019/050078; dated Mar. 1, 2019.

* cited by examiner

*Primary Examiner* — Selim U Ahmed
*Assistant Examiner* — Evan G Clinton
(74) *Attorney, Agent, or Firm* — Pramudji Law Group PLLC; Ari Pramudji

(57) ABSTRACT

Various implementations described herein are directed to an integrated circuit having a power gate cell and a first power distribution grid. The integrated circuit may include a second power distribution grid aligned with and disposed above the power gate cell. The second power distribution grid may be disposed between the power gate cell and the first power distribution grid.

22 Claims, 10 Drawing Sheets

Switch with Local Grid
Horizontal Straps on Top
Global Grid Runs over Switch,
Strap Locations are not related
to Local Grid Strap Locations Switch with Local Grid
Vertical Straps on Top
Global Grid runs over Switch,
Strap Locations are aligned to
Local Grid Strap Locations

POWER DISTRIBUTION CIRCUITRY

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In conventional circuit designs, global distribution wires are typically routed in upper metal layers. A standard cell's power rails are typically routed horizontally, and the power rails are connected to upper global metal grid layers through stacked metal and via layers, or totems. A power distribution network needs to be designed to ensure a minimal voltage value is delivered to the standard cell to ensure proper electrical behavior.

In some advanced technologies, resistance of lower metal and via layers that are used for a standard cell grid and totem structures are significantly higher than the upper metal grid layers. Generally, resistance increases when descending into a standard cell stack such that lower metal layers are more resistive than upper metal layers, wherein resistance increases with decreasing pitch. Further, via resistances are also significantly higher than metal layer resistances.

BRIEF DESCRIPTION OF THE DRAWINGS

Implementations of various power distribution techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to power distribution circuitry. For instance, various implementations described herein are directed to schemes, techniques and methods related to power distribution for silicon process technologies, such as, e.g., sub-64 nm metal pitched process technologies. Some implementations may be associated with power supply distribution and energy management along with methods for distributing power by way of a power distribution grid that is fabricated with pitched process technologies that seek to reduce and/or minimize current-resistance (IR) related drop, while achieving high efficiency for power switches. Some implementations may be associated with memory applications. Further, some implementations may be associated with methods that optimize power grid distribution by using knowledge of resistive properties for various metal and via layers available from a foundry. For highly resistive layers, design techniques described herein may include additional power routing layers and/or use of a local micro power grid that is disposed above a power switch cell to reduce IR drop. The local micro power grid is not within the power switch cell and is thus optimized as part of the power grid design. A local supplemental grid outside of the power gate cell permits cell placement flexibility and improves its input pin porosity.

Various implementations of power distribution circuitry will now be described in greater detail herein with reference to FIGS. 1-6E.

Figure 1:
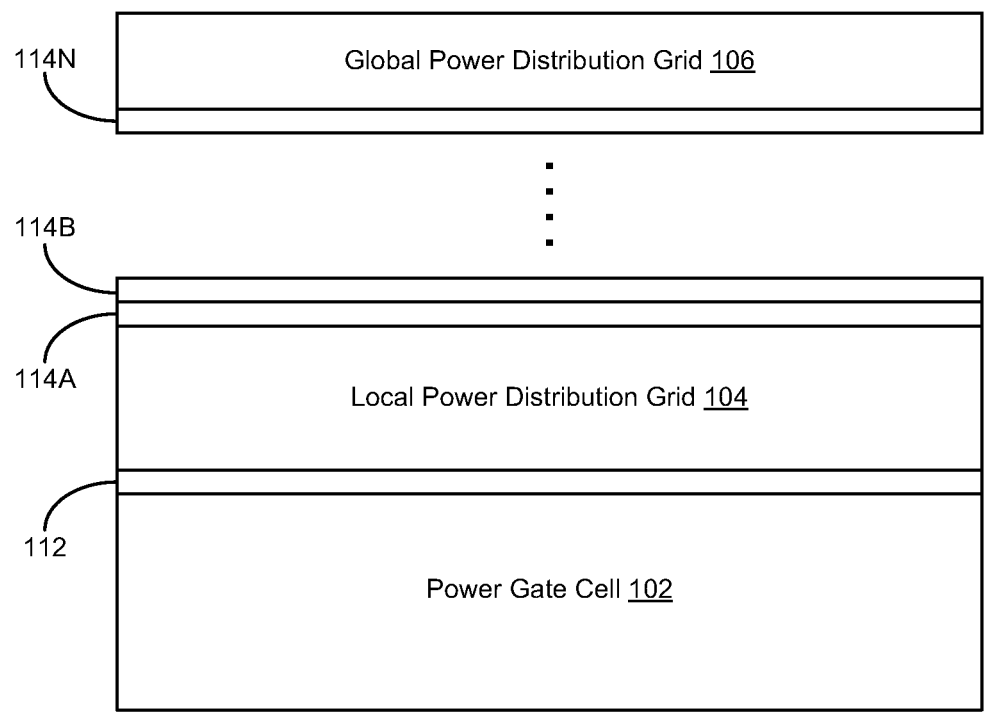
FIG. 1 illustrates a block diagram of power distribution circuitry in accordance with various implementations described herein.

FIG. 1 illustrates a diagram of power distribution circuitry 100 in accordance with various implementations described herein.

As shown in FIG. 1, the power distribution circuitry 100 may include multiple layers including, e.g., a multi-layered structure having a power gate cell 102, a first power distribution grid 106, and a second power distribution grid 104.

The power gate cell 102 may include one or more power gate circuits (or power switches, such as, e.g., one or more transistors operating as a power gate or switch) and one or more logic circuits (or logic gates, components, etc.). The power gate cell 102 may include one or more power gate pin layers 112. For instance, the power gate pin layer 112 may include one or more power gate pins used to electrically couple the power gate cell 102 to the first power distribution grid 106 and/or the second power distribution grid 104. The power gate pin layer 112 may include one or more metal layers and/or vias, such as, e.g., metal 2 (M2) layer and/or via 2 (V2). The power gate cell 102 may be referred to as a power gate, a power switch cell, or a power switch (PS).

The first power distribution grid 106 may be aligned with and disposed above the power gate cell 102 and/or the second power distribution grid 104. The first power distribution grid 106 may be electrically coupled to the power gate cell 102 and/or the second power distribution grid 104. The first power distribution grid 106 may include one or more metal layers and/or one or more vias. For instance, the first power distribution grid 106 may include at least one metal layer, such as, e.g., metal 9 (M9) layer that may be used to electrically couple the first power distribution grid 106 to the power gate cell 102 and/or the second power distribution grid 104. The first power distribution grid 106 may be referred to as a global power distribution grid or a block level grid. The first power distribution grid 106 may also be referred to as upper metal layers and/or vias.

The second power distribution grid 104 may be aligned with and disposed above the power gate cell 102. The second power distribution grid 104 may be disposed between the power gate cell 102 and the first power distribution grid 106. The second power distribution grid 104 may be disposed directly above and/or directly adjacent to the power gate cell 102. The second power distribution grid 104 may be separate from and different than the first power distribution grid

106. The first power distribution grid 106 may be disposed above the second power distribution grid 104. The second power distribution grid 104 may be referred to as a local (micro or mini) power distribution grid that is electrically coupled to the power gate cell 102.

Further, as shown, the second power distribution grid 104 may be electrically coupled to the power gate cell 102 and/or the first power distribution grid 106. In some instances, the second power distribution grid 104 may include one or more stacked totem structures having one or more metal layers and/or one or more vias. For example, the second power distribution grid 104 may include multiple metal layers and/or multiple vias, such as, e.g., metal 3 (M3) layer, via 3 (V3), metal 4 (M4) layer, and/or via 4 (V4), that may be used to electrically couple the second power distribution grid 104 to the power gate cell 102 and/or the first power distribution grid 106. In some cases, the M4 layer may be disposed orthogonal to the M3 layer. The second power distribution grid 104 may be referred to as a local or micro or mini power distribution grid. In addition, the second power distribution grid 104 may also be referred to as lower metal layers and/or vias.

The power distribution circuitry 100 may include one or more additional totem structures 114A, 114B, . . . , 114N including one or more additional metal layers and/or one or more additional vias. For instance, additional totem structures may include multiple additional metal layers along with multiple additional vias, such as, e.g., metal 5 (M5) to metal 8 (M8) layers and via 5 (M5) to via 8 (V8), that may be used to electrically couple the first power distribution grid 106 to the power gate cell 102 and/or the second power distribution grid 104. As shown, the first (or global) distribution grid 106 is disposed at a greater distance away from the power gate cell 102 than the second power distribution grid 104. In this instance, the second power distribution grid 104 may be disposed directly above and/or directly adjacent to the power gate cell 102. These additional metal layers and vias are described in greater detail herein below in reference to FIG. 3A.

Figure 2:
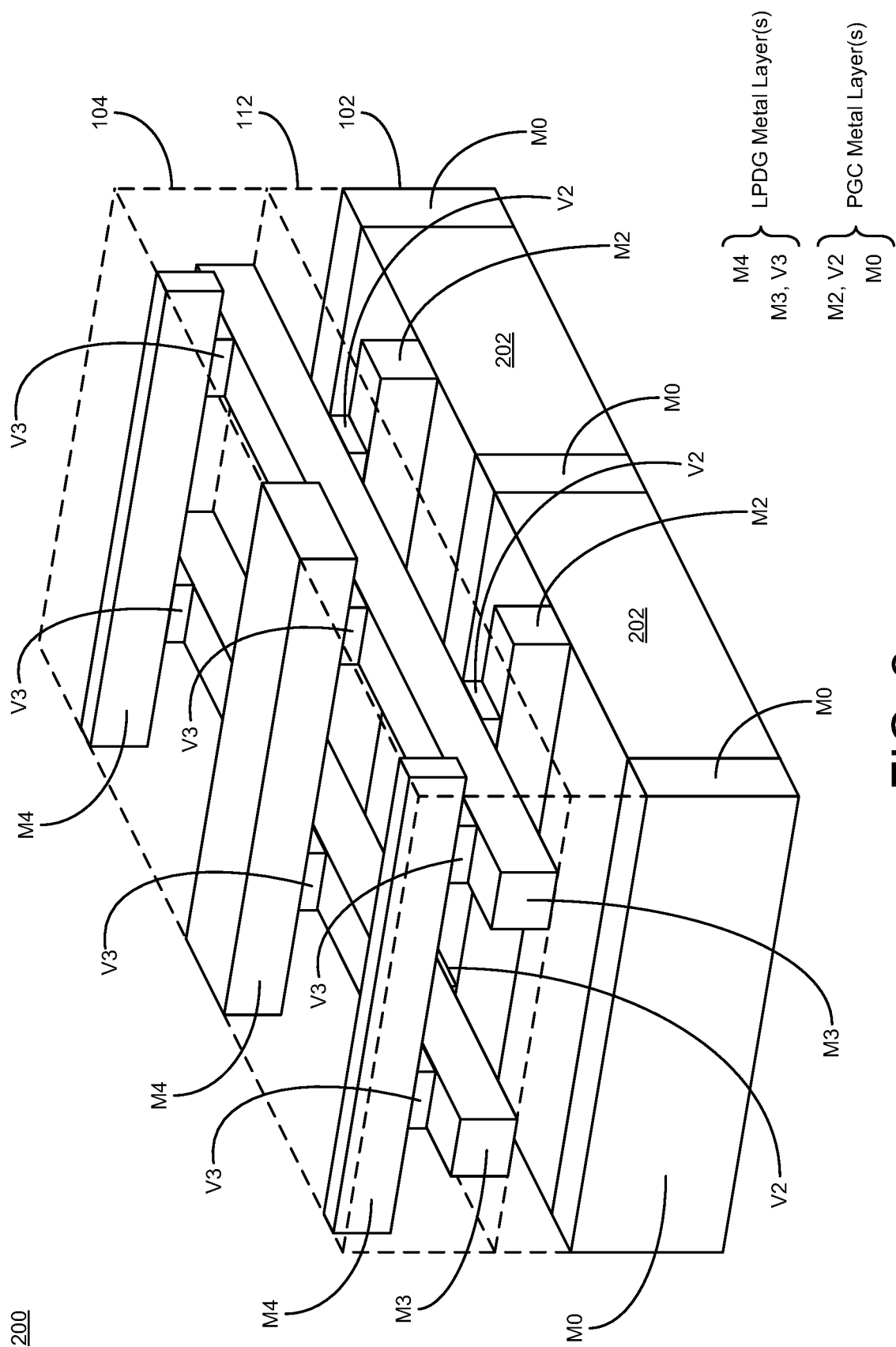
FIG. 2 illustrates another diagram of power distribution circuitry in accordance with various implementations described herein.

FIG. 2 illustrates a perspective view of another diagram of power distribution circuitry 200 in accordance with various implementations described herein.

As shown in FIG. 2, the power distribution circuitry 200 may include multiple layers including, e.g., a multi-layered structure having the power gate cell 102, the first power distribution grid (not shown), and the second power distribution grid 104.

The power gate cell 102 may include one or more cell portions 202 and at least one metal layer, such as, e.g., metal layer M0. The power gate cell 102 may include at least one power gate pin layer 112 having at least one power gate cell (PGC) metal layer, such as, e.g., metal 2 layer (M2), and at least one via, such as, e.g., via 2 (V2). In this instance, the power gate pin layer 112 (M2, V2) may include one or more power gate pins that may be used to electrically couple the power gate cell 102 to the first power distribution grid 106 and/or the second power distribution grid 104.

The second power distribution 104 may include multiple layers including, e.g., a multi-layered structure having multiple layers including LPDG metal layers M3, M4 and at least one via V3. As such, the second power distribution grid may also be referred to as local power distribution grid (LPDG). In some instances, as shown, the second power distribution grid 104 may include two or more layers that are orthogonal metal layers M3, M4. Further, each layer of the two or more layers M3, M4 may be adjustable (e.g., in a horizontal direction and/or in a vertical direction) so as to assist with aligning the second power distribution grid 104 with the power gate cell 102.

Figure 3A:
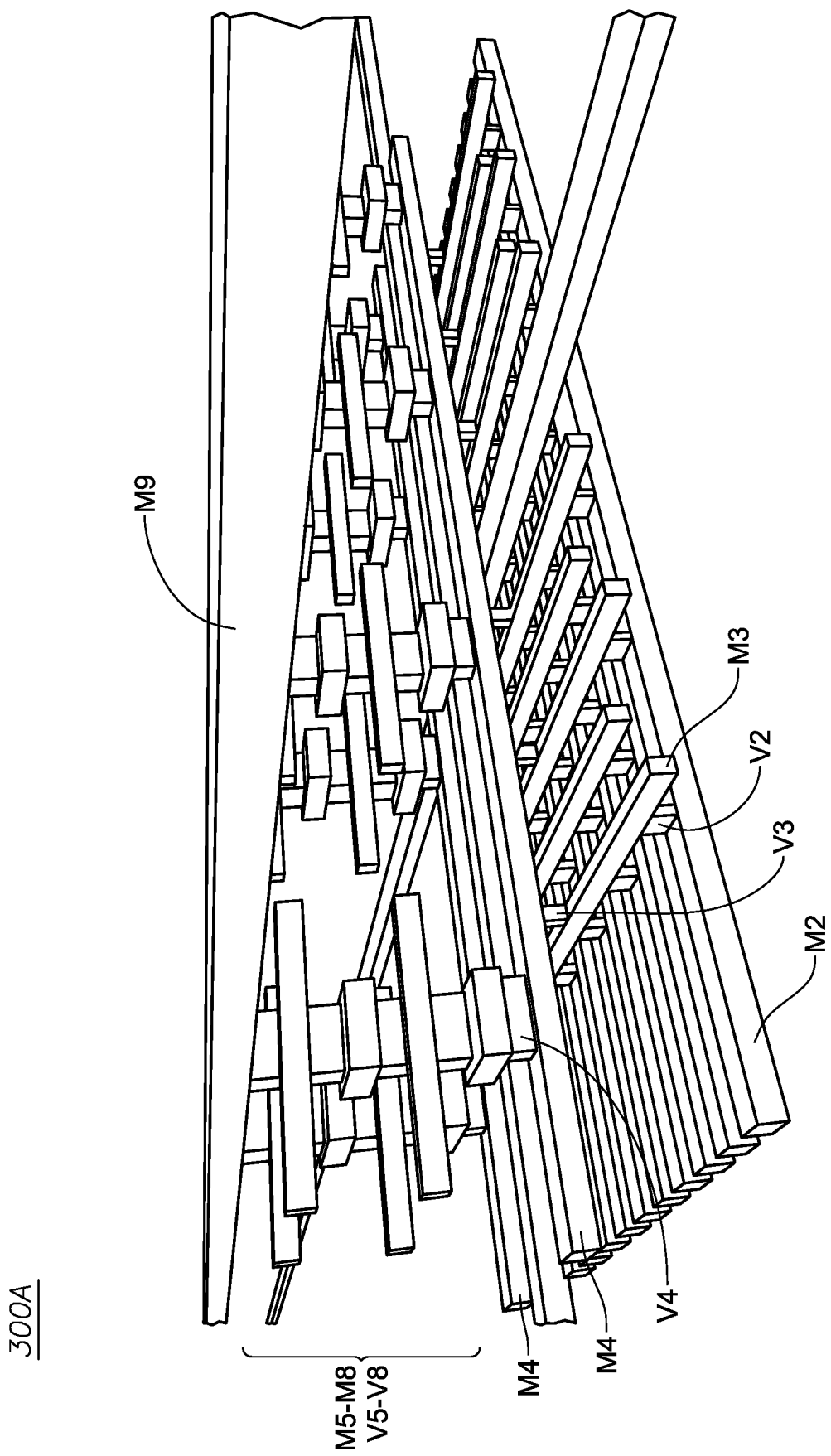
FIG. 3A illustrates a perspective view of power distribution circuitry 300A in accordance with various implementations described herein.

FIG. 3A illustrates a perspective view of power distribution circuitry 300A in accordance with various implementations described herein.

As shown in FIG. 3A, the power distribution circuitry 300A includes the power gate cell (PGC) metal layer M2, which may be referred to as power gate pins or power gate rails. The power distribution circuitry 300 includes vias V2 that electrically couple the M2 layer to the M3 layer. The power distribution circuitry 300A includes the local power distribution grid (LPDG) layers M3, M4, which are orthogonal to each other, and wherein vias V3 couple the M3 layer to the M4 layer. The power distribution circuitry 300A includes vias V4 that electrically couple the M4 layer to the upper metal layers M5-M9. In this instance, metal layers M5-M8 are coupled to the global power distribution grid (GPDG) layer M9 with vias V5-V8. As described herein, the first power distribution grid 106 may be referred to as the global power distribution grid (GPDG) or a block level grid.

Figure 3B:
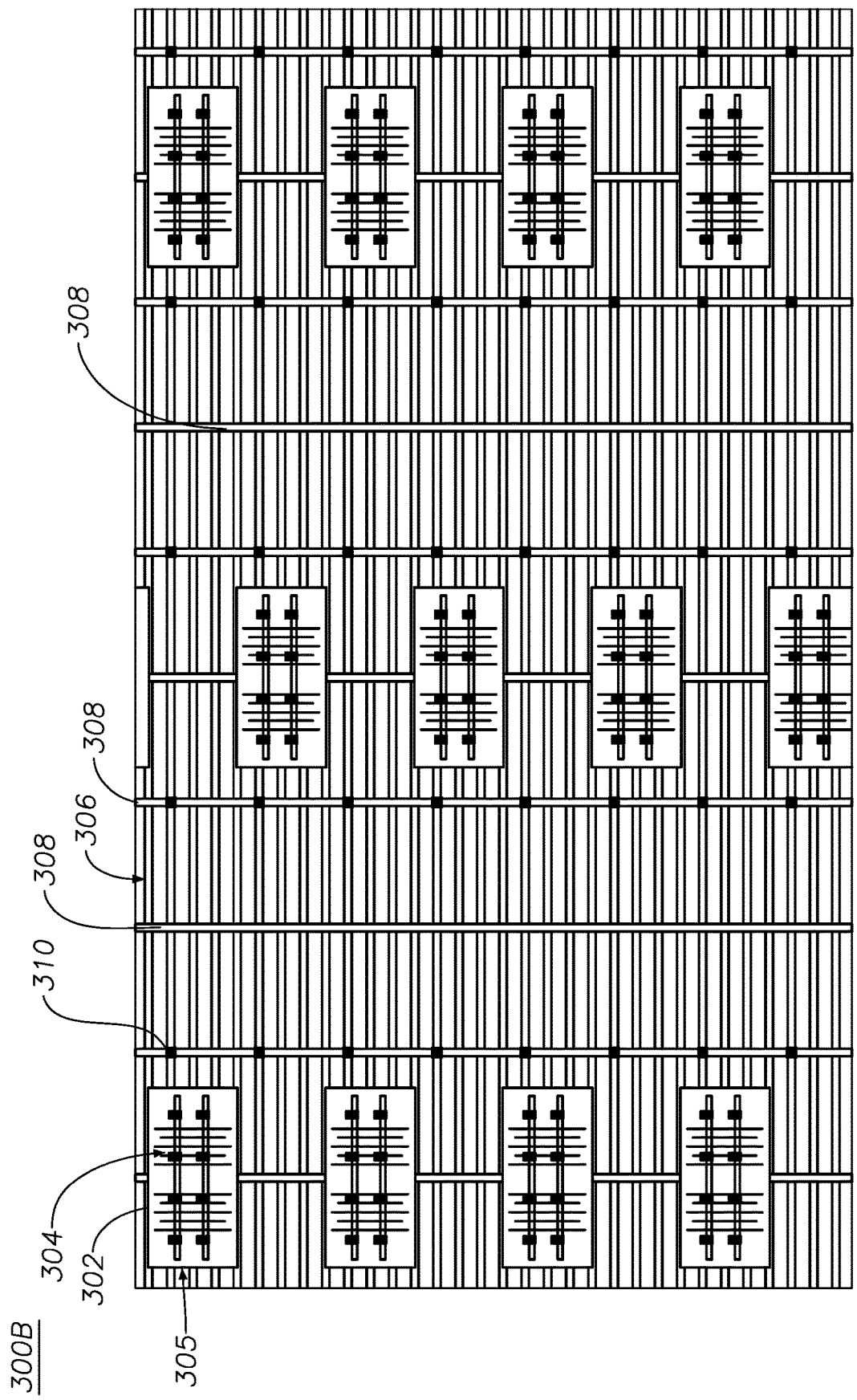
FIG. 3B illustrates a top view of power distribution circuitry 300B in accordance with various implementations described herein.

FIG. 3B illustrates a top view of power distribution circuitry 300B in accordance with various implementations described herein.

As shown in FIG. 3B, the power distribution circuitry 300B includes multiple power gate cells 302 with each cell 302 having a localized power grid 304 disposed within a cell boundary 305. Further, as shown, the power distribution circuitry 300B may include horizontal metal lines 306 that are part of a global power distribution grid which may be coupled to one or more or all of the power gate cells 302. In addition, vertical metal lines 308 may also be part of the global power distribution grid. As shown, the horizontal metal lines 306 may be coupled to the vertical metal lines 308 with vias 310. Hence, the global power distribution grid may resemble a waffle-shaped type structure. As described herein, the global power distribution grid 306 is disposed at a greater distance above (or away from) the power gate cells 302 than the localized power grids 304. The localized power grids 304 may be disposed directly above and/or directly adjacent to corresponding power gate cells 302.

Figure 4:
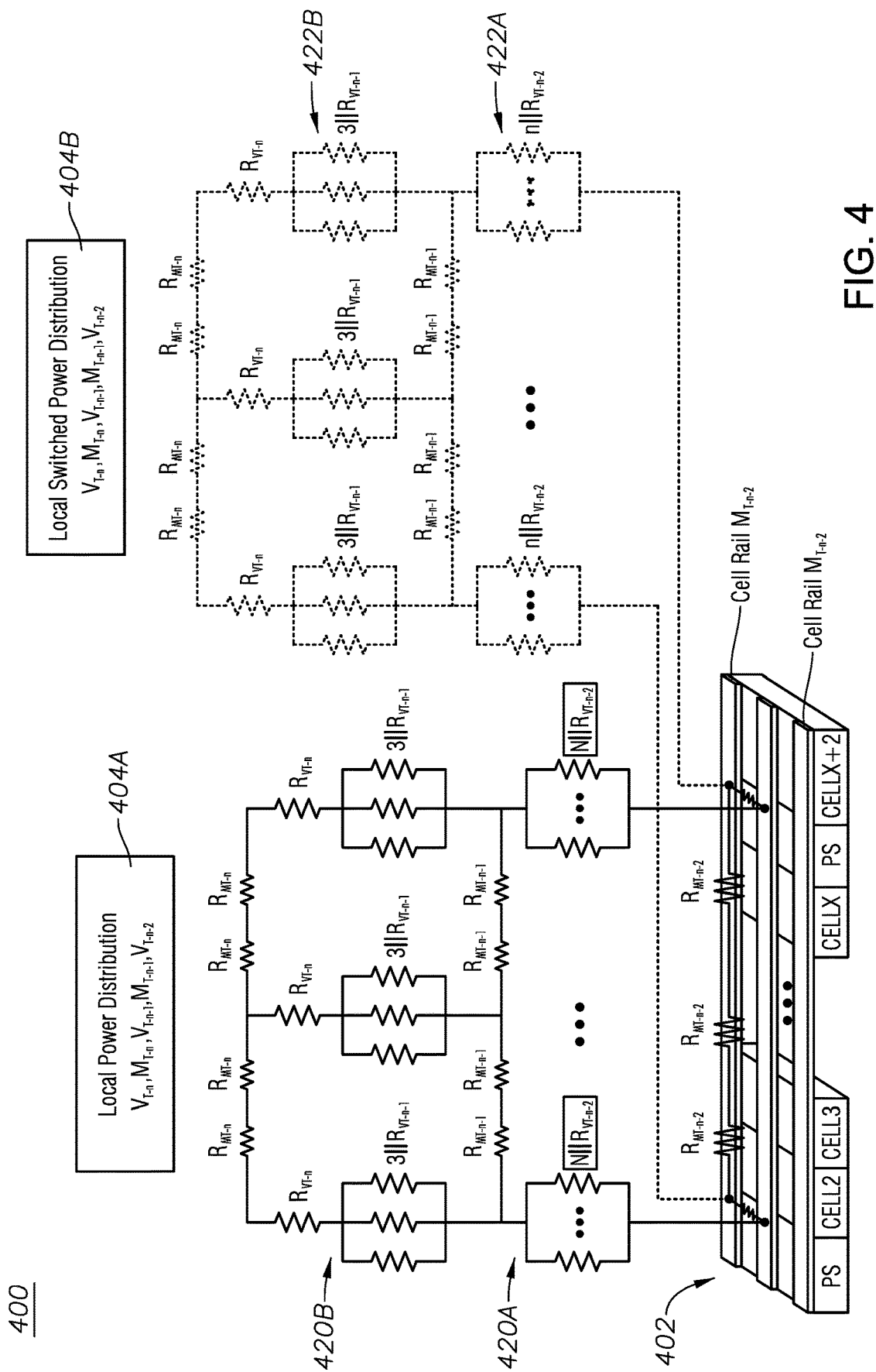
FIG. 4 illustrates a diagram of a resistive model of power distribution circuitry in accordance with implementations described herein.

FIG. 4 illustrates a diagram of a resistive model 400 of the power distribution circuitry in accordance with implementations described herein.

As shown in FIG. 4, the resistive model 400 of the power distribution circuitry includes a power gate cell 402 along with multiple resistive networks associated with an un-switched local (or micro or mini) power distribution grid 404A and a switched local (or micro or mini) power distribution grid 404B. In this instance, multiple metal layers having resistive components 420A, 420B, 422A, 422B are arranged (or modelled) in parallel so as to identify, analyze, and/or evaluate the reduction in resistance of the power distribution circuitry in accordance with implementations described herein.

Various implementations described herein provide for a localized micro (or mini) power distribution grid having additional horizontal and vertical metal layer routing along with redundant vias. This localized micro power distribution technique enables resistance parallelism and thus provides for a lower resistive local power distribution grid.

In some cases, switched local power distribution requirements may vary across different designs and within an individual design. Some block areas may require a dense grid while some other areas may tolerate a more relaxed grid. Various implementations described herein provide for a low resistive localized micro (or mini) power distribution grid that may be applied independently of the power grid switch standard cell. Thus, the localized micro grid may better facilitate power grid optimization and efficiency.

Figure 5:
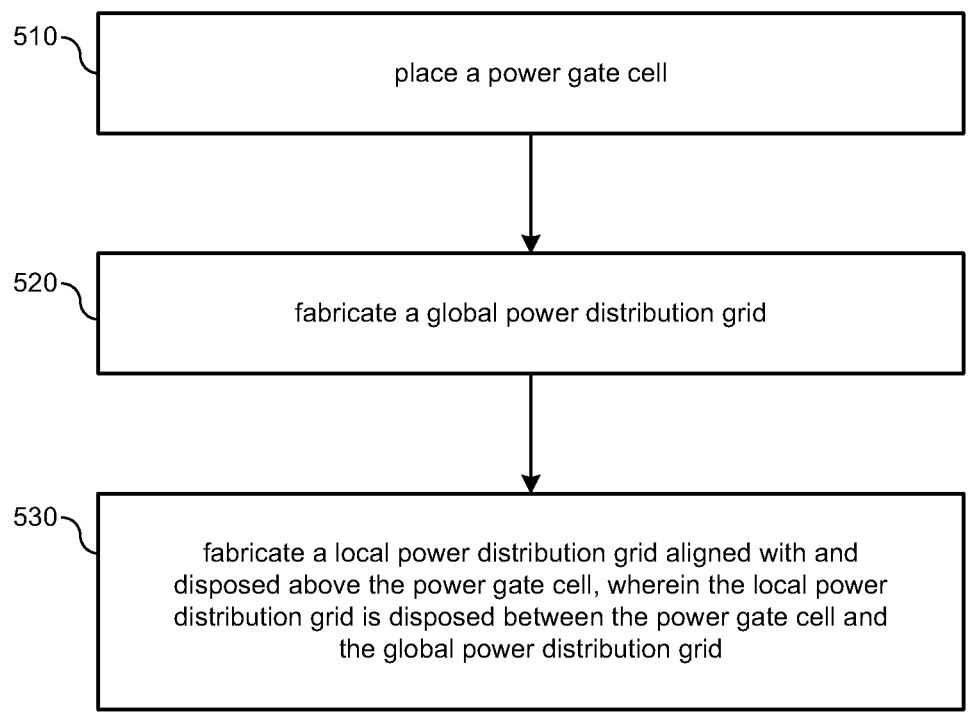
FIG. 5 illustrates a process flow diagram of a method for fabricating power distribution circuitry in accordance with implementations described herein.
Figure 6A:
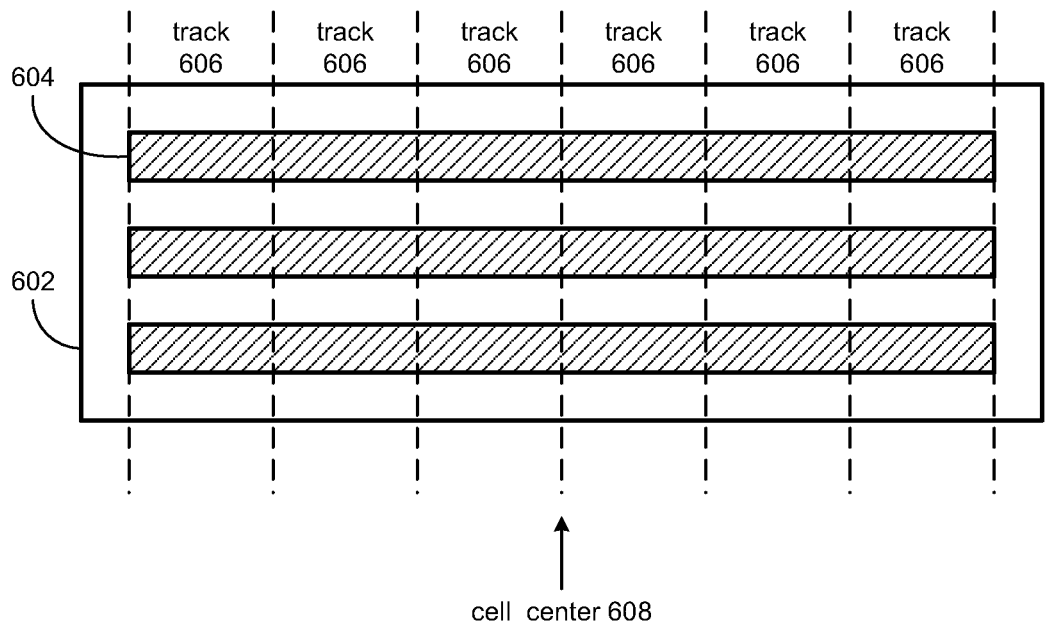
FIGS. 6A-6E illustrate various process diagrams associated with a method for fabricating power distribution circuitry according to implementations described herein.
Figure 6B:
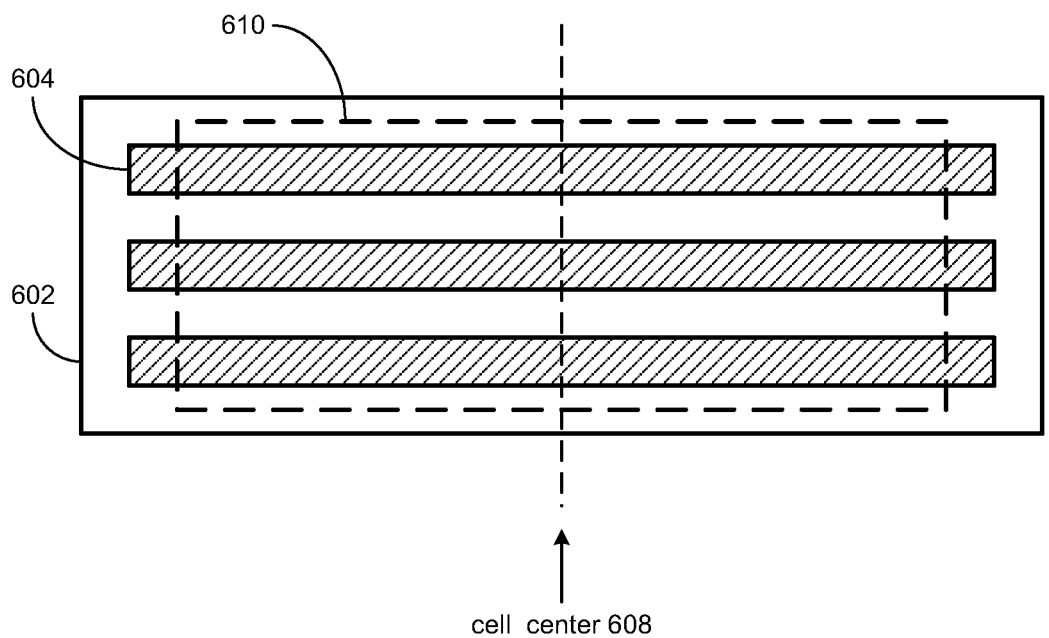
Figure 6C:
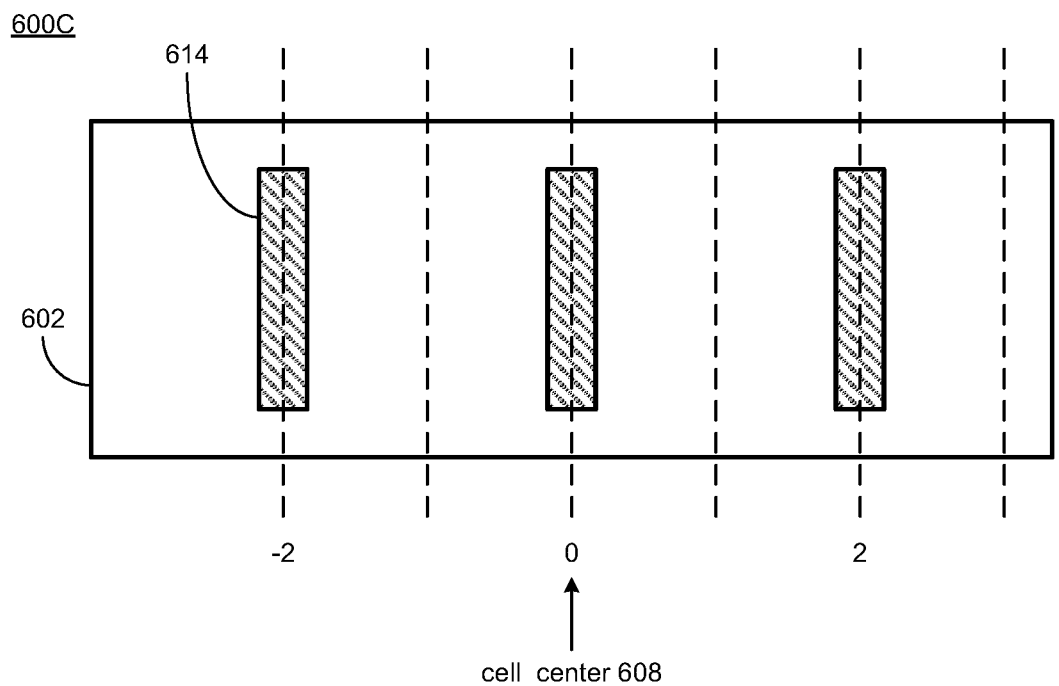
Figure 6D:
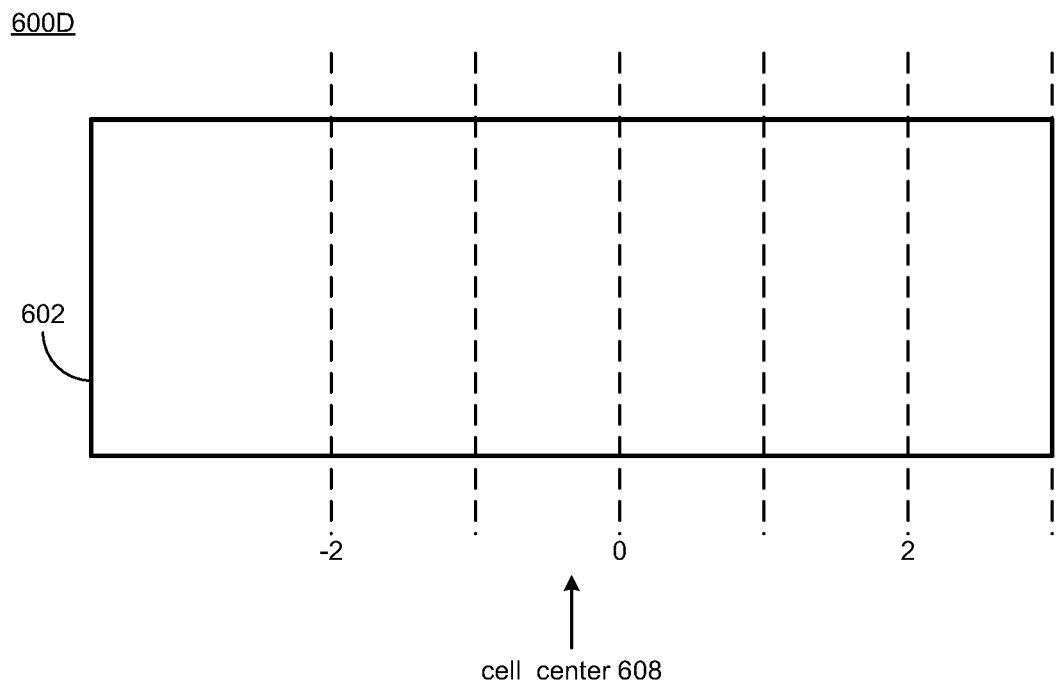
Figure 6E:
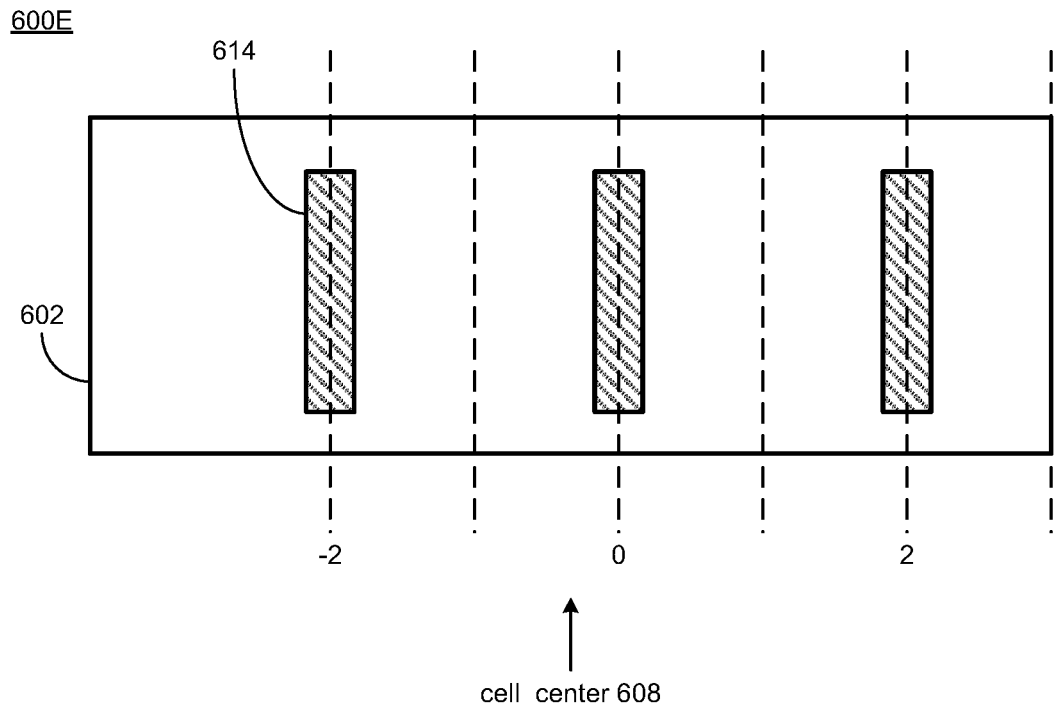

FIG. 5 illustrates a process flow diagram of a method 500 for fabricating power distribution circuitry in accordance with implementations described herein.

It should be understood that even though method 500 may indicate a particular order of operation execution, in some cases, various certain portions of the operations may be executed in a different order, and on different systems. In other cases, additional operations and/or steps may be added to and/or omitted from method 500. Also, method 500 may be implemented in hardware and/or software. If implemented in hardware, the method 500 may be implemented with various circuit elements, such as described herein above in reference to FIGS. 1-4. If implemented in software, method 500 may be implemented as a program or software instruction process that may be configured for power distribution circuitry as described herein. Further, if implemented in software, instructions related to implementing the method 500 may be stored in memory and/or a database. For instance, a computer or various other types of computing devices having a processor and memory may be configured to perform method 500.

As described and shown in reference to FIG. 5, method 500 may be utilized for manufacturing an integrated circuit (IC) that implements power distribution circuitry.

At block 510, method 500 may fabricate a power gate cell, e.g., by placing a power gate cell. In various instances, the power gate cell may be referred to as a power gate, a power switch cell, or a power switch. At block 520, method 500 may fabricate a global power distribution grid. At block 530, method 500 may fabricate a local power distribution grid aligned with and disposed above the power gate cell. In some implementations, the local power distribution grid may be disposed between the power gate cell and the global power distribution grid.

The global power distribution grid may be aligned with and disposed above the power gate cell and the local power distribution grid. The local power distribution grid may be disposed directly above and directly adjacent to the power gate cell. The local power distribution grid is separate from and different than the global power distribution grid, and the global power distribution grid is disposed above the local power distribution grid. The global power distribution grid is electrically coupled to the power gate cell, and the local power distribution grid is electrically coupled to the power gate cell. The global power distribution grid may include one or more metal layers, and the local power distribution grid may include two or more layers that are orthogonal metal layers. In some instances, each layer of the two or more layers are adjustable so as to assist with aligning the local power distribution grid with the power gate cell.

FIGS. 6A-6E illustrate various process flow diagrams 600A-600E associated with a method for fabricating power distribution circuitry in accordance with various implementations described herein.

Generally, logic cells are placed on a grid. Logic cells may be on an integer multiple of the grid. Logic cells typically fall on the grid for placement to be legal. The grid is uniform. Routing straps (metal) may also be placed on a grid for each layer. The straps in the local grid may be unidirectional, and layers may alternate between vertical and horizontal directions. Based on foundry design rules, straps may not have to be placed on a grid. Further, the placement grid and the routing may not align, and as such, there will be a maximum misalignment that may be calculated.

One goal of a local grid is to reduce resistance at input pins of power gate (or power switch). For each highly resistive layer, a target via resistance may be determined, wherein single via resistance/target resistance=predetermined number of vias. In some cases, the predetermined number may be adjusted to be an integer. One or more layers may have multiple single via options. Starting with the larger grid disposed above the power switch pins, a predetermined number of straps may be determined. In some cases, a predetermined number of vias/number of pins=predetermined number of straps, wherein the predetermined number may be adjusted to be an integer. Straps 604 may be evenly distributed across a power switch cell 602, and in some instances, a base design may assume that each track 606 for each layer is aligned with a cell center 608 of the power switch cell 602. (See diagram 600A of FIG. 6A). In some implementations, the straps 604 may refer to power switch pins.

Each strap may be placed over the pins such that the via may be legally coupled between the pin and strap. Straps 604 may need to have an inset 610 from the edge of the pin, and straps 604 may extend from top/bottom of the pin area and be large enough to ensure proper via enclosure. (See diagram 600B of FIG. 6B). In some cases, a legal strap location bounding box may be based on via enclosure needs, and a maximum misalignment between the placement grid and the routing layer may be accounted for. This may move the bounding box in from the left to the right, and left and right edges may be maximum, and top/bottom may be minimum. Foundry design rules may specify a minimum allowed spacing between straps, which may be honored by local grid straps. Also, a maximum number of straps that may fit in a bounding box may be determined, wherein an actual number of straps=min (predetermined, bounding box max). Relative locations from the cell center 608 to place other straps 614 may be determined. (See diagram 600C of FIG. 6C). In some cases, this process is repeated for each local grid layer, and the resulting structure may be referred to as a baseline local grid structure. For each placed switch instance, and for each local grid layer, the following operations may be performed. (See diagram 600D of FIG. 6D). In this instance, a closet track for a layer to the cell center 608 is found, this track is the center of the local grid for this layer, and the other straps 614 for this layer are inserted based on predetermined offsets. (See diagram 600E of FIG. 6E).

Figure 7A:
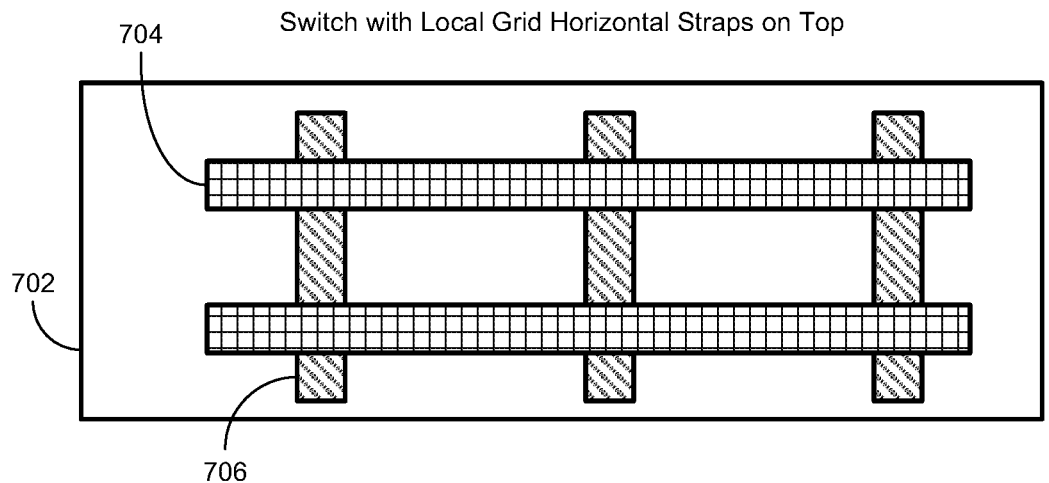
FIGS. 7A-7C illustrate various diagrams associated with fabricating power distribution circuitry according to implementations described herein.
Figure 7B:
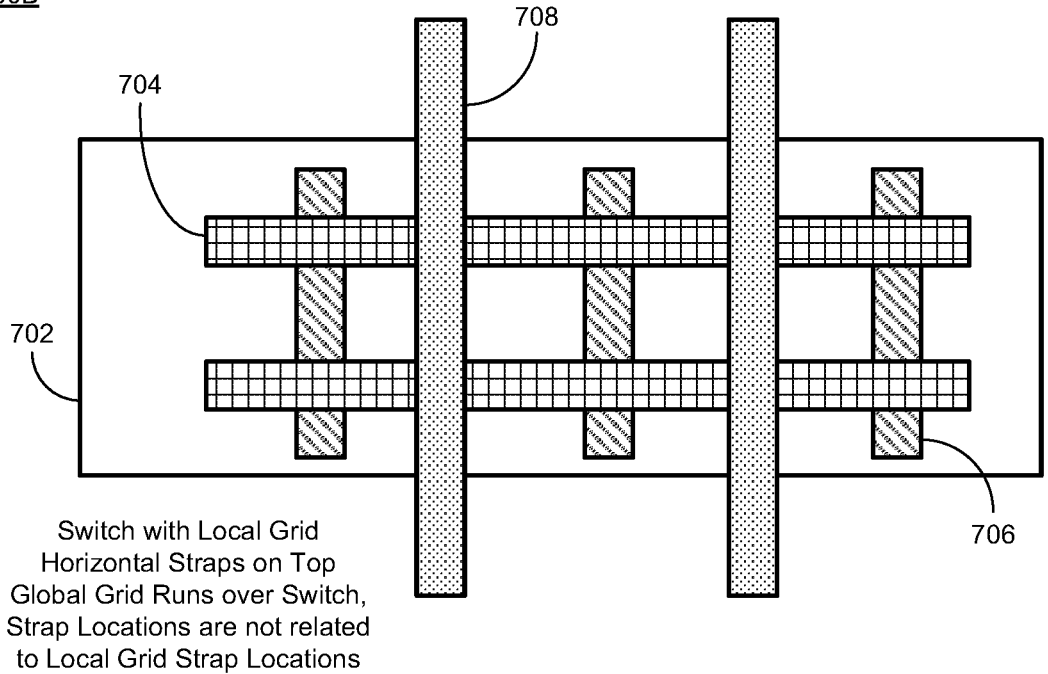
Figure 7C:
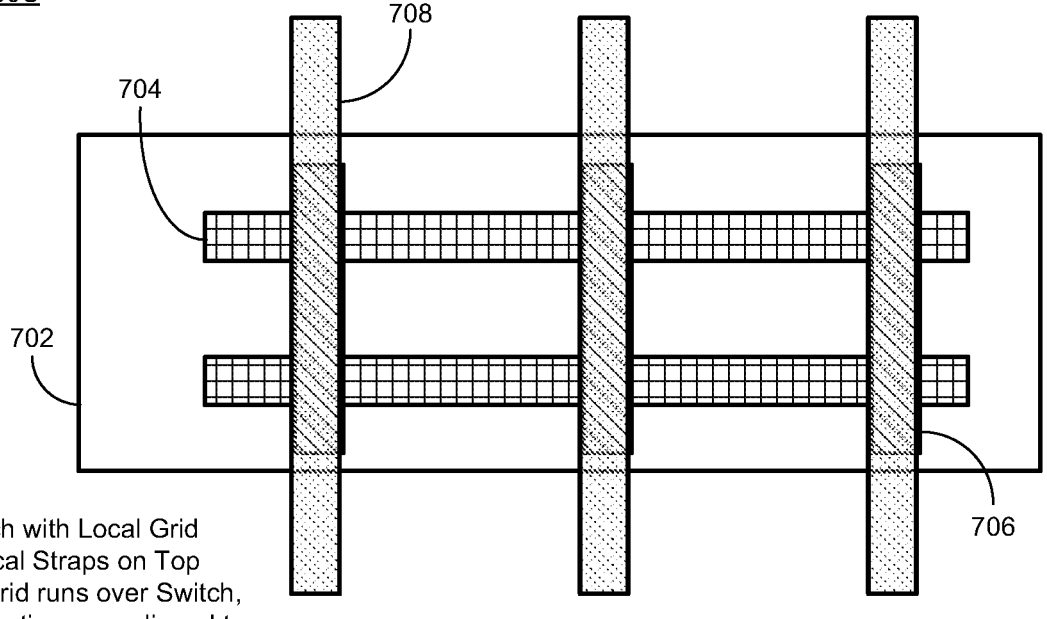

FIGS. 7A-7C illustrate various diagrams associated with fabricating power distribution circuitry according to implementations described herein.

FIG. 7A shows a diagram 700B of a switch 702 (i.e., power switch cell) with local grid horizontal straps 704 on top of (or overlying) vertical straps 706. FIG. 7B shows a diagram 700B of the switch 702 (i.e., power switch cell) with the local grid horizontal straps 704 on top, wherein global grid straps 708 run over the switch 702 (i.e., power switch cell), and wherein locations of the global grid straps 708 are not related to locations of the local grid straps 704. Further, FIG. 7C shows a diagram 700C of the switch 702 (i.e., power switch cell) with the local grid vertical straps 706 on top, wherein the global grid straps 708 run over the switch 702 (i.e., power switch cell), and wherein the locations of the global grid straps 708 are related to the locations of the local grid straps 704. In some implementations, in reference to FIG. 7C, the aligned straps do not need to be the same width.

In some implementations, the global power distribution grid (GPDG) is aligned with and disposed above the power gate cell (PGC) and the local power distribution grid (LPDG). For instance, at least part of the global power distribution grid (GPDG) overlies the local power distribution grid (LPDG) so that these two grids can connect. In some instances, these two grids do not have to strictly align. In other instances, with respect to aligning, the local power distribution grid (LPDG) may have a shape on a routing layer, and the global power distribution grid (GPDG) may have a shape on another routing layer. In this instance, these grids are aligned if they are both in the same routing direction (e.g., vertical) and overlap each other in the x-direction (i.e., horizontal). However, it may be possible that the local power distribution grid (LPDG) ends on a horizontal layer and connects to a vertical layer in the global power distribution grid (GPDG), or vice versa. Further, in some instances, these two grids may need to have at least one area of overlap so as to insert via(s).

Described herein are various implementations of an integrated circuit. The integrated circuit may include a power gate cell and a first power distribution grid. The integrated circuit may include a second power distribution grid aligned with and disposed above the power gate cell. The second power distribution grid may be disposed between the power gate cell and the first power distribution grid.

Described herein are various implementations of an integrated circuit. The integrated circuit may include a power gate cell and a global power distribution grid electrically coupled to the power gate cell. The integrated circuit may include a local power distribution grid electrically coupled to the power gate cell. The local power distribution grid is aligned with and disposed above the power gate cell. The local power distribution grid is disposed between the power gate cell and the global power distribution grid.

Described herein are various implementations of a method for manufacturing an integrated circuit. The method may include fabricating a power gate cell and fabricating a global power distribution grid. The method may include fabricating a local power distribution grid aligned with and disposed above the power gate cell. The local power distribution grid may be disposed between the power gate cell and the global power distribution grid.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
a power gate cell comprising cell portions with one or more power switches, at least one metal layer and one or more power gate pin layers, wherein the at least one metal layer is disposed between the one or more cell portions, wherein the power gate cell is disposed in a first layer of a multi-layered structure having the first layer, a second layer and a third layer, wherein the one or more power gate pin layers have one or more power gate pins used to electrically couple the power gate cell to at least one of the second layer and the third layer;
a first power distribution grid disposed in the third layer above the first layer; and
a second power distribution grid aligned with and disposed in the second layer above the power gate cell in the first layer, wherein the second power distribution grid is disposed in the second layer between the power gate cell in the first layer and the first power distribution grid in the third layer, wherein the one or more power gate pins of the one or more power gate pin layers disposed in the first layer are used to electrically couple the power gate cell in the first layer to at least one of the second power distribution grid in the second layer and the first power distribution grid in the third layer.

2. The integrated circuit of claim 1, wherein the first power distribution grid is aligned with and disposed above the power gate cell and the second power distribution grid, wherein the first power distribution grid is adjustable with respect to at least one of the power gate cell and the second power distribution grid so as to be aligned therewith.

3. The integrated circuit of claim 1, wherein the second power distribution grid is disposed directly above and directly adjacent to the power gate cell, wherein at least a portion of the first and second power distribution grids horizontally overlap with a portion of the power gate cell.

4. The integrated circuit of claim 1, wherein the second power distribution grid is separate from and different than the first power distribution grid, and wherein the first power distribution grid is disposed above the second power distribution grid.

5. The integrated circuit of claim 1, wherein the first power distribution grid comprises a global power distribution grid that is electrically coupled to the power gate cell.

6. The integrated circuit of claim 1, wherein the second power distribution grid comprises a local power distribution grid that is electrically coupled to the power gate cell.

7. The integrated circuit of claim 1, wherein the first power distribution grid comprises one or more metal layers.

8. The integrated circuit of claim 1, wherein the second power distribution grid comprises two or more layers that are orthogonal metal layers.

9. The integrated circuit of claim 8, wherein each layer of the two or more layers are adjustable so as to assist with aligning the second power distribution grid with the power gate cell.

10. The integrated circuit of claim 1, wherein the one or more power switches comprise one or more transistors.

11. The integrated circuit of claim 1, wherein the second power distribution grid is disposed above the one or more power switches and the one or more power gate pin layers.

12. The integrated circuit of claim 1, wherein:
the at least one metal layer comprises a metal 0 (M0) layer,
the one or more power gate pin layers comprises a metal 2 (M2) layer; and
the second power distribution grid comprises a metal 3 (M3) layer, a metal 4 (M4) layer, or combinations thereof.

13. An integrated circuit, comprising:
a power gate cell comprising cell portions with one or more power switches, at least one metal layer and one or more power gate pin layers, wherein the at least one metal layer is disposed between the one or more cell portions, wherein the power gate cell is disposed in a first layer of a multi-layered structure having the first layer, a second layer and a third layer, wherein the one or more power gate pin layers have one or more power gate pins used to electrically couple the power gate cell to at least one of the second layer and the third layer;
a global power distribution grid electrically coupled to the power gate cell via the one or more power gate pins of the one or more power gate pin layers in the first layer, wherein the global power distribution grid is disposed in the third layer; and
a local power distribution grid electrically coupled to the power gate cell via the one or more power gate pins of the one or more power gate pin layers in the first layer, wherein the local power distribution grid is aligned with and disposed above the power gate cell, and wherein the local power distribution grid is disposed in the second layer between the power gate cell in the first layer and the global power distribution grid in the third layer.

14. The integrated circuit of claim 13, wherein the global power distribution grid is aligned with and disposed above the power gate cell and the local power distribution grid.

15. The integrated circuit of claim 13, wherein the local power distribution grid is disposed directly above and directly adjacent to the power gate cell, wherein at least a portion of the global and local power distribution grids horizontally overlap with a portion of the power gate cell.

16. The integrated circuit of claim 13, wherein the local power distribution grid is separate from and different than the global power distribution grid, and wherein the global power distribution grid is disposed above the local power distribution grid.

17. The integrated circuit of claim 13, wherein the global power distribution grid and the local power distribution grid are electrically coupled to the power gate cell.

18. The integrated circuit of claim 13, wherein the global power distribution grid comprises one or more metal layers.

19. The integrated circuit of claim 13, wherein the local power distribution grid comprises two or more layers that are orthogonal metal layers.

20. The integrated circuit of claim 19, wherein each layer of the two or more layers are adjustable so as to assist with aligning the second power distribution grid with the power gate cell.

21. The integrated circuit of claim 13, wherein the one or more power switches comprise one or more transistors.

22. A method of manufacturing an integrated circuit, comprising:
fabricating a power gate cell, wherein the power gate cell comprises cell portions with one or more power switches, at least one metal layer and one or more power gate pin layers, wherein the at least one metal layer is disposed between the one or more cell portions, wherein the power gate cell is disposed in a first layer of a multi-layered structure having the first layer, a second layer and a third layer, wherein the one or more power gate pin layers have one or more power gate pins used to electrically couple the power gate cell to at least one of the second layer and the third layer;
fabricating a global power distribution grid in the third layer; and
fabricating a local power distribution grid aligned with and disposed in the second layer above the power gate cell in the first layer, wherein the local power distribution grid is disposed in the second layer between the power gate cell in the first layer and the global power distribution grid in the third layer, wherein the one or more power gate pins of the one or more power gate pin layers disposed in the first layer are used to electrically couple the power gate cell in the first layer to at least one of the local power distribution grid in the second layer and the global power distribution grid in the third layer.

* * * * *